(12) United States Patent
Ju et al.

(10) Patent No.: US 9,416,049 B2
(45) Date of Patent: *Aug. 16, 2016

(54) LOW-E PANELS AND METHODS FOR FORMING THE SAME

(71) Applicant: Intermolecular Inc., San Jose, CA (US)

(72) Inventors: Tong Ju, Santa Clara, CA (US); Jeremy Cheng, Cupertino, CA (US); Guowen Ding, San Jose, CA (US); Minh Huu Le, San Jose, CA (US); Daniel Schweigert, Fremont, CA (US); Guizhen Zhang, Santa Clara, CA (US)

(73) Assignee: Intermolecular, Inc., San Jose, CA (US)

( * ) Notice: Subject to any disclaimer, the term of this patent is extended or adjusted under 35 U.S.C. 154(b) by 40 days.

This patent is subject to a terminal disclaimer.

(21) Appl. No.: 14/312,104

(22) Filed: Jun. 23, 2014

(65) Prior Publication Data

US 2015/0368152 A1 Dec. 24, 2015

(51) Int. Cl.
| | | |
|---|---|---|
| *B32B 15/04* | (2006.01) | |
| *B32B 17/06* | (2006.01) | |
| *C03C 17/34* | (2006.01) | |
| *C23C 14/08* | (2006.01) | |
| *C23C 14/18* | (2006.01) | |
| *C23C 14/34* | (2006.01) | |

(52) U.S. Cl.
CPC ........... *C03C 17/3417* (2013.01); *C23C 14/081* (2013.01); *C23C 14/086* (2013.01); *C23C 14/185* (2013.01); *C23C 14/3464* (2013.01); *C03C 2217/211* (2013.01); *C03C 2217/214* (2013.01); *C03C 2217/216* (2013.01); *C03C 2217/218* (2013.01); *C03C 2217/29* (2013.01); *C03C 2217/74* (2013.01); *C03C 2218/15* (2013.01)

(58) Field of Classification Search
USPC ......... 428/426, 428, 432, 433, 434, 688, 689, 428/697, 699, 701, 702
See application file for complete search history.

(56) References Cited

U.S. PATENT DOCUMENTS

| | | | |
|---|---|---|---|
| 5,591,529 A | 1/1997 | Braatz et al. | |
| 5,821,001 A | 10/1998 | Arbab et al. | |
| 6,210,784 B1 * | 4/2001 | Rondeau | C03C 17/36 359/580 |
| 6,451,434 B1 * | 9/2002 | Ebisawa | B32B 17/10174 428/432 |
| 6,524,647 B1 * | 2/2003 | Varanasi | C03C 17/2453 427/166 |
| 6,541,133 B1 * | 4/2003 | Schicht | C03C 17/2453 427/164 |
| 6,797,389 B1 * | 9/2004 | Depauw | B32B 17/10036 427/163.1 |
| 6,833,194 B1 | 12/2004 | O'Shaughnessy | |
| 7,153,579 B2 | 12/2006 | Kriltz | |
| 7,267,879 B2 * | 9/2007 | Thomsen | C03C 17/36 428/428 |
| 7,413,768 B2 | 8/2008 | O'Shaughnessy | |

(Continued)

FOREIGN PATENT DOCUMENTS

| | | |
|---|---|---|
| EP | 1194385 B9 | 2/2012 |
| WO | WO-00-76930 A1 | 12/2000 |

*Primary Examiner* — Lauren R Colgan

(57) ABSTRACT

Embodiments provided herein describe low-e panels and methods for forming low-e panels. A transparent substrate is provided. A reflective layer is formed above the transparent substrate. A dielectric layer is formed between the transparent substrate and the reflective layer. The dielectric layer includes niobium, tin, and aluminum.

15 Claims, 6 Drawing Sheets

(56) References Cited

U.S. PATENT DOCUMENTS

| | | | |
|---|---|---|---|
| 7,582,356 B2 * | 9/2009 | Brochot | B32B 17/10174 428/336 |
| 2003/0165694 A1 * | 9/2003 | Hartig | C03C 17/36 428/428 |
| 2003/0228476 A1 * | 12/2003 | Buhay | B32B 17/10036 428/469 |
| 2004/0005467 A1 * | 1/2004 | Neuman | B32B 17/10174 428/432 |
| 2004/0241406 A1 * | 12/2004 | Nadaud | B32B 17/10036 428/212 |
| 2004/0258928 A1 * | 12/2004 | Arbab | C03C 17/36 428/434 |
| 2005/0238923 A1 * | 10/2005 | Thiel | B32B 17/10 428/701 |
| 2007/0009747 A1 * | 1/2007 | Medwick | C03C 17/36 428/432 |
| 2007/0081228 A1 * | 4/2007 | Hartig | C03C 17/36 359/359 |
| 2007/0134500 A1 * | 6/2007 | Hartig | C03C 17/09 428/432 |
| 2008/0138547 A1 * | 6/2008 | Maschwitz | C03C 17/36 428/34 |
| 2008/0311389 A1 * | 12/2008 | Roquiny | C03C 17/36 428/336 |
| 2009/0004412 A1 * | 1/2009 | Decroupet | C03C 17/36 428/34 |
| 2009/0011205 A1 * | 1/2009 | Thiel | B32B 17/10036 428/215 |
| 2009/0169846 A1 * | 7/2009 | Siddle | C03C 17/36 428/216 |
| 2010/0136365 A1 * | 6/2010 | Unquera | C03C 17/36 428/623 |
| 2011/0135955 A1 * | 6/2011 | Maschwitz | B32B 17/10036 428/623 |
| 2011/0261442 A1 * | 10/2011 | Knoll | C03C 17/36 359/360 |
| 2011/0262726 A1 * | 10/2011 | Knoll | C03C 17/36 428/213 |
| 2013/0164561 A1 * | 6/2013 | Hassan | C03C 17/36 428/702 |
| 2013/0344321 A1 * | 12/2013 | McSporran | C03C 17/36 428/336 |

* cited by examiner

|  |  |  | NbSnAlOx | |
|---|---|---|---|---|
|  |  |  | AC | HT |
| Monolithic Optics (Ill °C, 2 deg obs) | T | Y (%) | 79.53 | 82.58 |
|  |  | a* | -3.13 | -2.17 |
|  |  | b* | 1.14 | 2.37 |
|  | Rg | Y (%) | 5.74 | 6.27 |
|  |  | a* | -0.01 | -2.02 |
|  |  | b* | -5.06 | -4.94 |
|  | Rf | Y (%) | 4.9 | 5.58 |
|  |  | a* | -5.61 | -4.42 |
|  |  | b* | 2.1 | 0.23 |
|  | Rg(45deg) | Y (%) | 7.55 | 8.4 |
|  |  | a* | 4.07 | 1 |
|  |  | b* | -4.47 | -4.9 |
| A[vis] (100-TT-Rf) | | | 14.73 | 11.84 |
| IGU Optics (Ill °C, 2 deg obs) | T | Y (%) | 72.1 | 74.9 |
|  |  | a* | -3.77 | -2.89 |
|  |  | b* | 1.24 | 2.46 |
|  | Rg | Y (%) | 10.1 | 11.2 |
|  |  | a* | -5.14 | -4.02 |
|  |  | b* | 1.56 | 1.06 |
|  | Rf | Y (%) | 12.2 | 12.7 |
|  |  | a* | -2.93 | -2.56 |
|  |  | b* | 0.51 | -0.27 |
| Normal Emissivity (EN) | | | 0.018 | 0.012 |
| HT - AC | Rf ΔE* | | 2.91 | |
|  | Rg ΔE* | | 2.42 | |
|  | Rg ΔE* @ 45° | | 3.57 | |
|  | T ΔE* | | 2.07 | |
|  | T \|Δb*\| | | 1.23 | |
|  | T ΔY% (HT > AC) | | 3.05 | |
| NFRC | Tvis (%) | | 72.1 | 75 |
|  | SHGC(2) | | 36.4 | 38.9 |
|  | Uval | | 1.57 | 1.61 |
|  | LSG(2) | | 1.98 | 1.93 |

FIG. 4

LOW-E PANELS AND METHODS FOR FORMING THE SAME

The present invention relates to low-e panels. More particularly, this invention relates to low-e panels with novel materials and methods for forming such low-e panels.

BACKGROUND OF THE INVENTION

Low emissivity, or low-e, panels are often formed by depositing a reflective layer (e.g., silver), along with various other layers, onto a transparent (e.g., glass) substrate. The other layers typically include various dielectric and metal oxide layers, such as silicon nitride, tin oxide, and zinc oxide, to provide a barrier between the stack and both the substrate and the environment, as well as to act as optical fillers and improve the optical characteristics of the panel.

When used in, for example, windows, and depending on the particular environment (i.e., climate), it may be desirable for the low-e panels to allow visible light to pass through the window while blocking other types of solar radiation, such as infra-red. Such panels are often referred to as having a high light-to-solar gain (LSG) ratio.

Currently available low-e panels are able to achieve LSG ratios of 1.8, or even higher, by using coating with more than one reflective layer (i.e., "double silver" coatings, "triple silver" coatings, etc.) However, these coatings typically exhibit changes in, for example, optical performance (e.g., color) if they are exposed to a heat treatment, such as that often performed to temper the glass substrate. As a result, different coatings must be used depending on whether or not a heat treatment will subsequently be performed.

Stacks in which a heat treatment causes little or no change in performance, do exist for low-e panels suitable for some applications. However, these low-e panels typically only utilize a single reflective layer, and thus have relatively low LSG ratios (e.g., less than 1.5).

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 4 is a table of data related to various performance characteristics for low-e panels according to some embodiments.

DETAILED DESCRIPTION

A detailed description of one or more embodiments is provided below along with accompanying figures. The detailed description is provided in connection with such embodiments, but is not limited to any particular example. The scope is limited only by the claims, and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The term "horizontal" as used herein will be understood to be defined as a plane parallel to the plane or surface of the substrate, regardless of the orientation of the substrate. The term "vertical" will refer to a direction perpendicular to the horizontal as previously defined. Terms such as "above", "below", "bottom", "top", "side" (e.g. sidewall), "higher", "lower", "upper", "over", and "under", are defined with respect to the horizontal plane. The term "on" means there is direct contact between the elements. The term "above" will allow for intervening elements.

Some embodiments provide low-e optical coatings (and/or panels) capable of achieving high light-to-solar gain (LSG) ratios (e.g., greater than 1.9), which do not experience significant changes in performance (e.g., color, visible transmission, solar heat gain coefficient (SHGC), etc.) from undergoing a heat treatment, such as a tempering process. Such coatings may, for example, be used in windows/low-e panels in warm climates in which it is desirable to allow visible light to pass through, while preventing heat from entering the interior of the building. In some embodiments, the low-e stack includes a dielectric layer between the transparent substrate and the reflective layer (e.g., silver). The dielectric layer may include niobium, tin, aluminum, or a combination thereof. In some embodiments, the dielectric layer is made of niobium-tin-aluminum oxide.

Figure 1:
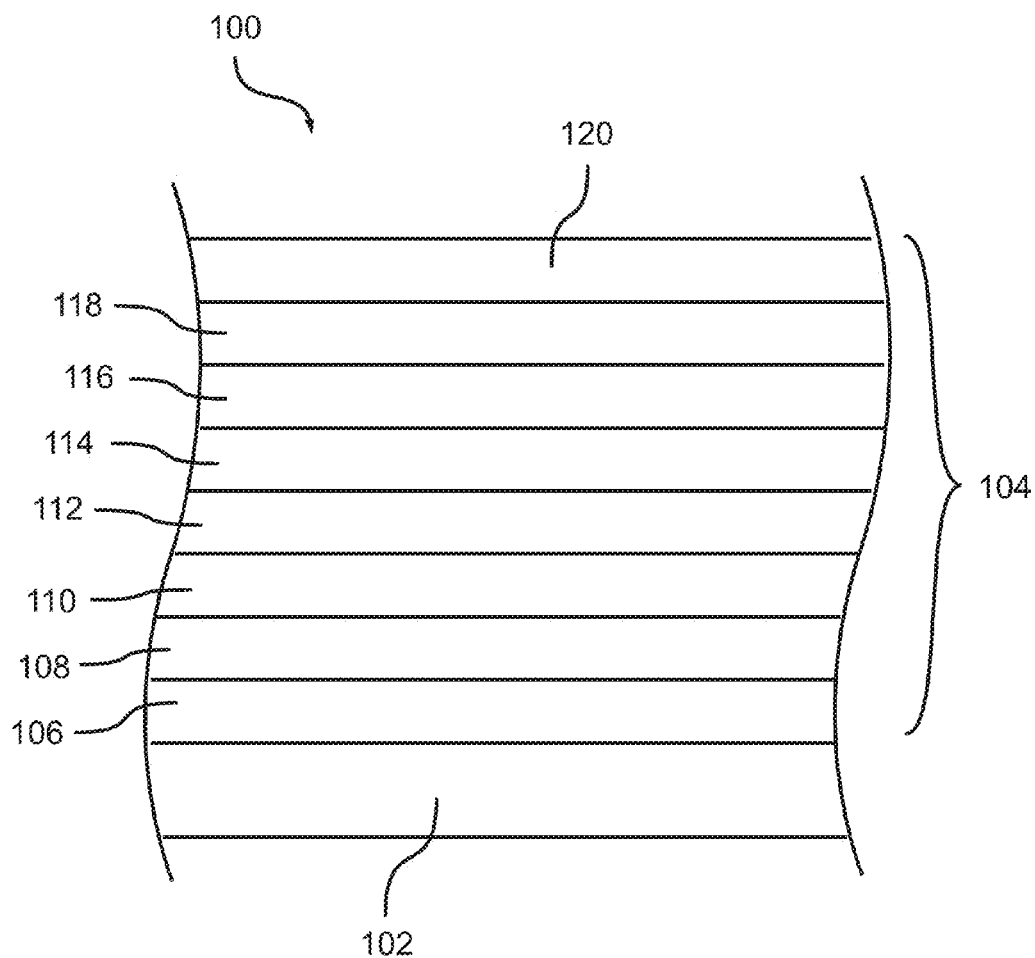
FIG. 1 is a cross-sectional side view of a low-e panel according to some embodiments.

FIG. 1 illustrates a low-e panel 100 according to some embodiments. The low-e panel 100 includes a transparent substrate 102 and a low-e stack 104 formed above the transparent substrate 102. The transparent substrate 102 in some embodiments is made of a low emissivity glass, such as borosilicate glass. However, in some embodiments, the transparent substrate 102 may be made of plastic or a transparent polymer, such as polyethylene terephthalate (PET), poly(methyl methacrylate) (PMMA), polycarbonate (PC), and polyimide (PI). The transparent substrate 102 has a thickness of, for example, between about 1 and about 10 millimeters (mm). In a testing environment, the transparent substrate 102 may be round with a diameter of, for example, about 200 or about 300 mm. However, in a manufacturing environment, the transparent substrate 102 may be square or rectangular and significantly larger (e.g., about 0.5-about 6 meters (m) across).

The low-e stack 104 includes a base layer 106, a dielectric layer 108, a seed layer 110, a reflective layer 112, a barrier layer 114, a first over-coating layer 116, a second over-coating layer 118, and a protective layer 120. Exemplary details as to the functionality provided by each of the layers 106-120 are provided below.

The various layers in the low-e stack 104 may be formed sequentially (i.e., from bottom to top) above the transparent substrate 102 using, for example, a physical vapor deposition (PVD) and/or reactive sputtering processing tool. In some embodiments, the low-e stack 104 is formed above the entire substrate 102. However, in some embodiments, the low-e stack 104 may only be formed above isolated portions of the transparent substrate 102. Although the layers may be described as being formed "above" the previous layer (or the substrate), it should be understood that in some embodiments, each layer is formed directly on (and adjacent to) the previously provided/formed component (e.g., layer). In some embodiments, additional layers may be included between the layers, and other processing steps may also be performed between the formation of various layers.

The base layer 106 is formed above the transparent substrate 102. The base layer 106 may be made of a metal oxide and have a thickness of, for example, between about 100 Å and about 180 Å, such as about 150 Å. In some embodiments, the base layer 106 is made of zinc-tin oxide. Other suitable materials are, for example, titanium oxide, zinc oxide, tin oxide, and other metal alloy oxides, such as aluminum-tin oxide. The base layer 106 may be used to tune the optical properties (e.g., color, transmittance, etc.) of the low-e panel 100 as a whole, as well as to enhance silver nucleation.

The dielectric layer 108 is formed above the base layer 106. In some embodiments, the dielectric layer 108 includes niobium and tin and may have an amorphous phase. In some embodiments, the dielectric layer 108 also includes aluminum. In some embodiments, the dielectric layer 108 is made of niobium-tin-aluminum oxide. In some embodiments, the dielectric layer is formed using physical vapor deposition (e.g., sputtering). The dielectric layer 108 may be formed by, for example, simultaneously sputtering (i.e., co-sputtering) niobium oxide from a first target and tin-aluminum oxide from a second target (e.g., in a PVD tool, an example of which is described below). In some embodiments, the dielectric layer 108 may include, by weight, at least twice as much tin-aluminum oxide as niobium oxide (i.e., at least twice as much tin-aluminum oxide as niobium oxide may be deposited during the forming of the dielectric layer 108). For example, the weight ratio of the sputtered niobium oxide to the sputtered tin-aluminum oxide may be about 1:2.3. In some embodiments, the dielectric layer has a thickness of, for example, between about 100 Å and about 180 Å, such as about 150 Å. The dielectric layer 108 may be used to provide a separation between the base layer 106 and the seed layer 110.

The seed layer 110 is formed above the dielectric layer 108. The seed layer 110 is made of a metal oxide and may have a thickness of, for example, between about 80 Å and about 120 Å, such as about 100 Å. In some embodiments, the metal oxide used in the seed layer 110 is zinc oxide. The seed layer 110 may be used to enhance the deposition/growth of the reflective layer 112 in the low-e stack 104 (e.g., enhance the crystalline structure and/or texturing of the reflective layer 112) and increase the transmission of the stack 104 for anti-reflection purposes. In some embodiments, the seed layer 110 may be made of tin oxide or may not be included at all.

The reflective layer 112 is formed above the seed layer 110. In some embodiments, the reflective layer 112 is made of silver and has a thickness of, for example, between about 80 Å and about 120 Å, such as about 100 Å. As is commonly understood, the reflective layer 112 is used to reflect infra-red electro-magnetic radiation, thus reducing the amount of heat that may be transferred through the low-e panel 100.

The barrier layer 114 is formed over the reflective layer 112. The barrier layer 114 may include, for example, nickel, titanium, niobium, or a combination thereof. For example, in some embodiments, the barrier layer is made of nickel-titanium-niobium oxide. The barrier layer 114 may have a thickness of, for example, between about 30 Å and about 100 Å, such as about 80 Å. The barrier layer 114 is used, for example, to protect the reflective layer 112 from the processing steps used to form the subsequent layers of the low-e stack 104 and to prevent any interaction of the material of the reflective layer 112 with the materials of the other layers of the low-e stack 104, which may result in undesirable optical characteristics, such as poor color performance, of the low-e panel 100.

Still referring to FIG. 1, the first over-coating layer 116 is formed above the barrier layer 114. The first over-coating layer 116 may be made of a metal oxide and have a thickness of, for example, between about 100 Å and about 180 Å, such as about 150 Å. In some embodiments, the first over-coating layer 116 is made of the same material as the base layer 108 (e.g., zinc-tin oxide).

The second over-coating layer 118 is formed above the first over-coating layer 116. The second over-coating layer 118 may be made of a metal oxide and have a thickness of, for example, between about 100 Å and about 180 Å, such as about 150 Å. In some embodiments, the first over-coating layer 116 is made of the same material as the seed layer 108 (e.g., zinc oxide).

The first and second over-coating layers 116 and 118 may be used to further tune the optical properties of the low-e panel 100 as a whole. Additionally, in some embodiments, the first and second over-coating layers 116 and 118 may enhance the LSG ratio of the low-e panel 100.

Still referring to FIG. 1, the protective (or capping) layer 120 is formed above the second over-coating layer 118. The protective layer 120 may be made of dielectric material, such as silicon nitride, and have a thickness of, for example, between about 200 Å and about 300 Å, such as about 250 Angstroms (A). The protective layer 120 may be used to provide additional protection for the lower layers of the stack 104 and further adjust the optical properties of the low-e panel 100. The protective layer 120 may also be considered to be an over-coating layer (i.e., a third over-coating layer).

Additionally, although not shown in FIG. 1, it should be understood that an additional protective layer may be formed between the transparent substrate 102 and the base layer 106. This additional (or lower) protective layer may be made of the same material (e.g., silicon nitride) as the (upper) protective layer 120 and have a thickness of, for example, between about 100 Å and 250 Å. This additional protective layer may protect the other layers in the stack 104 from any elements which may otherwise diffuse from the transparent substrate 102 and may be used to tune the optical properties (e.g., transmission) of the low-e stack 104 and/or the low-e panel 100 as a whole.

One skilled in the art will appreciate that the embodiment depicted in FIG. 1 is a "single silver" low-e panel (i.e., having one reflective/silver layer). However, in some embodiments, the low-e panel 100 (or the low-e stack 104) is formed as a "double silver," or even a "triple silver," low-e panel (i.e., having two or three reflective/silver layers). In such embodiments, other layers in the low-e stack 104 may be replicated more than once along with the reflective layer. For example, in a double silver low-e panel, a set of additional layers, including an additional dielectric layer, seed layer, reflective layer, barrier layer, and first over-coating layer, similar to those described above, may be sequentially formed between the first over-coating layer 116 and the second over-coating layer 118.

Figure 2:
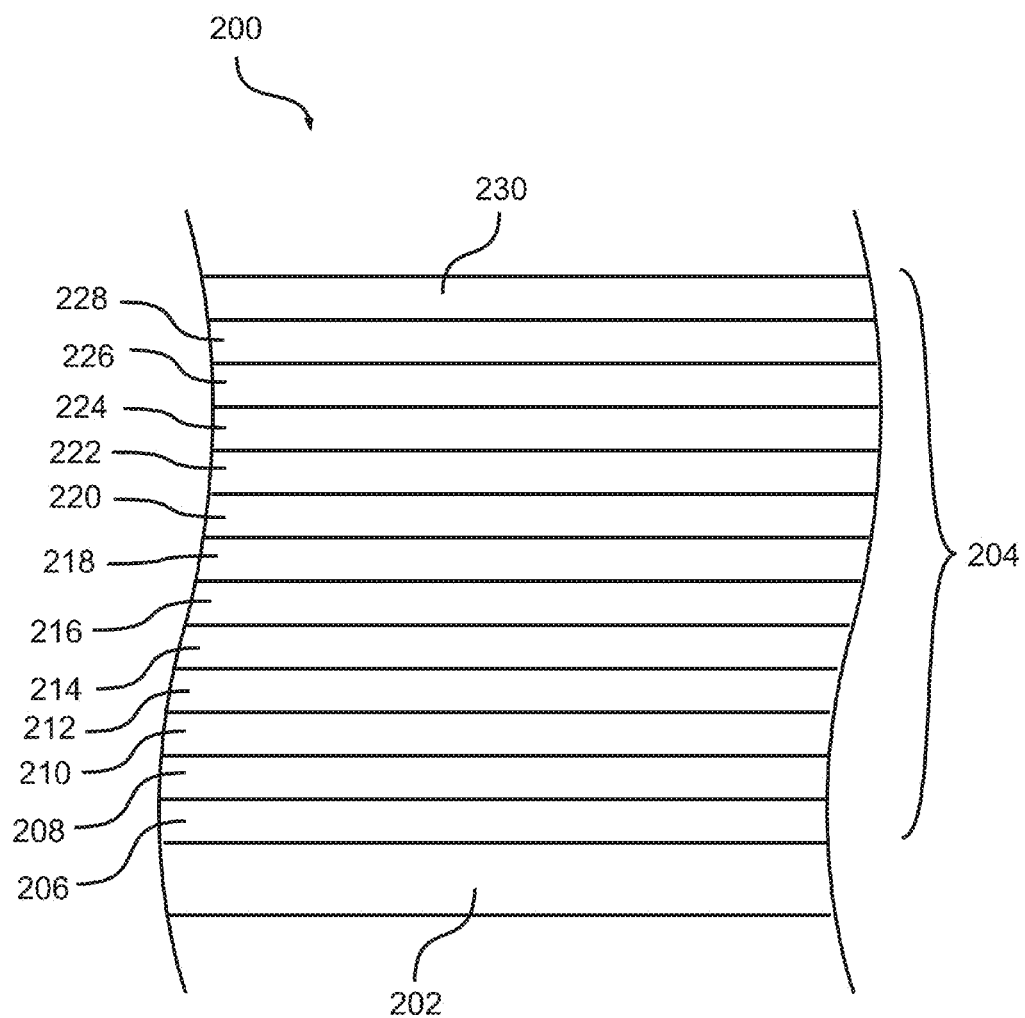
FIG. 2 is a cross-sectional side view of a low-e panel according to some embodiments.

An example of a "double silver" low-e panel 200 is shown in FIG. 2. The low-e panel 200 includes a transparent substrate 202 and a low-e stack 204 formed above the transparent substrate 202. The transparent substrate 202 may be similar to that described above. The low-e stack 204 includes a first (or lower) base layer 206, a first dielectric layer 208, a first seed layer 210, a first reflective layer 212, a first barrier layer 214, a second (or upper) base layer 216, a second dielectric layer 218, a second seed layer 220, a second reflective layer 222, a second barrier layer 224, a first over-coating layer 226, a second over-coating layer 228, and a protective layer 230. Each of the layers of the double silver low-e panel 200 may have the same properties (e.g., material, thickness, etc.) as the similarly named layers of the low-e panel 100 shown in FIG. 1 and described above.

It should be noted that depending on the materials used, some of the layers of the low-e stack (e.g., low-e stack 104 and low-e stack 204) may have some materials in common. For example, in the embodiments described above, the base layer and the first over-coating layer may be made of the same material (e.g., zinc-tin oxide). Similarly, the seed layer and the second over-coating layer may be made of the same material (e.g., zinc oxide).

It should also be understood that the low-e panel (e.g., low-e panel 100 and low-panel 200) may be a portion of (or installed in) a larger, more complex device or system, such as a low-e window. Such a window may include multiple glass substrates (or panes), other coatings (or layers), such a thermochromic coating formed on a different pane than the low-e stack, and various barrier or spacer layers formed between adjacent panes.

Figure 3:
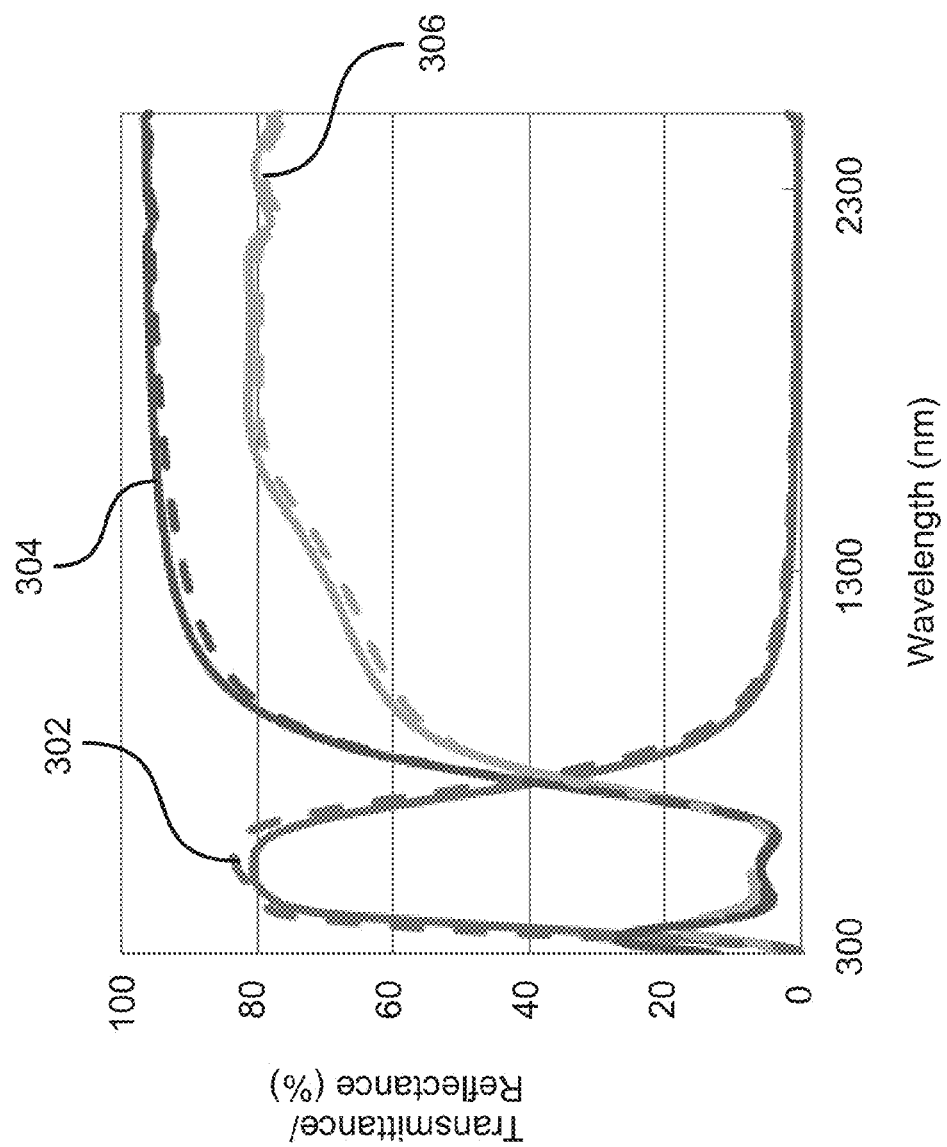
FIG. 3 is a graph depicting transmittance and reflectance for low-e panels according to some embodiments.

Low-e panels formed in accordance with embodiments described herein showed very little change in visible transmission (or transmittance) and reflection (or reflectance) due to the heat treatment (e.g., 72.1% as-coated and 74.9% after heat treatment). FIG. 3 graphically illustrates the transmittance and reflectance, both before and after heat treatment, for low-e panels in accordance with some embodiments. In particular, line group 302 depicts transmittance, with the solid line in line group 302 depicting the transmittance before heat treatment (i.e., as-coated) and the dashed line in line group 302 depicting the transmittance after heat treatment. As shown, the transmittance for visible light (i.e., 380-780 nm) is relative high, peaking at about 80%, both before and after heat treatment (i.e., the heat treatment changed transmittance very little).

Still referring to FIG. 3, line group 304 depicts reflectance for electro-magnetic radiation passing through the low-e panels from the side of the substrate with the low-e stack (i.e., the coating side). The solid line in line group 304 depicts this reflectance before heat treatment, and the dashed line depicts this reflectance after heat treatment. As shown, the reflectance for the coating side increases dramatically (to over 90%) for electro-magnetic radiation with wavelengths longer than that of visible light (i.e., greater than 780 nm) and is affected very little by the heat treatment. Line group 306 depicts reflectance for electro-magnetic radiation passing through the low-e panels from the side of the substrate opposite the low-e stack (i.e., the substrate (or glass) side). The solid line in line group 306 depicts this reflectance before heat treatment, and the dashed line depicts this reflectance after heat treatment. As shown, the reflectance for the substrate side, though not quite as high as the coating side, increases dramatically for electro-magnetic radiation with wavelengths longer than that of visible light and is affected very little by the heat treatment.

Other characteristics of the low-e panels described herein (e.g., including the niobium-tin-aluminum oxide layer dielectric layer(s) described above) are shown in the table depicted in FIG. 4. "AC" indicates data for the as-coated low-e panels, and "HT" indicates data for the low-e panels after a high temperature treatment (e.g. tempering). Data are presented for both monolithic low-e panels (e.g., Monolithic Optics) and dual-pane low-e panels (e.g., IGU Optics). Due to the distribution of cones in the eye, the color observance may depend on the observer's field of view. Standard (colorimetric) observer is used, which was taken to be the chromatic response of the average human viewing through a 2 degree angle, due to the belief that the color-sensitive cones reside within a 2 degree arc of the field of view. Thus, the measurements are shown for the 2 degree Standard Observer.

The various characteristics listed in FIG. 4 will be understood and appreciated by one skilled in the art. For example, intensity of reflected visible wavelength light, (e.g., "reflectance") is defined for glass side "g" or for film side "f". Intensity from glass side reflectance, (e.g., $R_gY$), shows light intensity measured from the side of the glass substrate opposite the side of the coated layers. Intensity from film side reflectance, (e.g., $R_fY$), shows light intensity measured from the side of the glass substrate on which the coated layers are formed. Transmittance, (e.g., TY), shows light intensity measured for the transmitted light.

The color characteristics are measured and reported herein using the CIE LAB a*, b* coordinates and scale (i.e. the CIE a*b* diagram, Ill. CIE-C, 2 degree observer). In the CIE LAB color system, the "L*" value indicates the lightness of the color, the "a*" value indicates the position between magenta and green (more negative values indicate stronger green and more positive values indicate stronger magenta), and the "b*" value indicates the position between yellow and blue (more negative values indicate stronger blue and more positive values indicate stronger yellow).

Emissivity (E) is a characteristic of both absorption and reflectance of light at given wavelengths. It can usually represented as a complement of the reflectance by the film side, (e.g., $E=1-R_f$). For architectural purposes, emissivity values can be important in the far range of the infrared spectrum, (e.g., about 2,500-40,000 nm). Thus, the emissivity value reported here includes normal emissivity (EN), as measured in the far range of the infrared spectrum. Haze is a percentage of light that deviates from the incident beam greater than 2.5 degrees on the average.

Data are also shown for the difference between heat treated and as-coated low-e panels. The value ΔE* (and Δa*, Δb*, ΔY) are important in determining whether or not upon heat treatment (HT) there is matchability, or substantial matchability, of the coated panels. For purposes of example, the term Δa*, for example, is indicative of how much color value a* changes due to heat treatment. Also, ΔE* is indicative of the change in reflectance and/or transmittance (including color appearance) in a coated panel after a heat treatment. ΔE* corresponds to the CIELAB Scale L*, a*, b*, and measures color properties before heat treatment ($L_0$*, $a_0$*, $b_0$*) and color properties after heat treatment ($L_1$*, $a_1$*, $b_1$*):

$$\Delta E^* = \sqrt{(\Delta L^*)^2 + (\Delta a^*)^2 + (\Delta b^*)^2}$$

where $\Delta L^* = L_1^* - L_0^*$, $\Delta a^* = a_1^* - a_0^*$, and $\Delta b^* = b_1^* - b_0^*$.

The color change of glass side reflection can be calculated as Rg ΔE*. The color change of light transmission can be calculated as T ΔE*, T|Δa*| and T|Δb*|. The luminance change of light transmission can be calculated as T ΔY.

Low-e panels (and/or low-e windows) utilizing the low-e stacks described above, particularly in a double (or triple) silver configuration, may demonstrate a high LSG ratio (e.g., greater than 1.9). Additionally, these low-e panels may show very little or no change in performance after undergoing a heat treatment. For example, in some embodiments, the low-e panels exhibited very low emissivity (i.e., normal emissivity (EN) both before (i.e., as-coated) and after heat treatment (e.g., 0.018 as-coated and 0.012 after heat treatment). The solar heat gain coefficient (SHGC) of the low-e panels was also affected very little by the heat treatment (e.g., 36.4 as-coated and 38.9 after heat treatment). Further, the low-e panels described herein exhibit a low $R_g$ $\Delta E^*$ value (i.e. the color change on the glass side) when comparing the as-coated and the heat treated data (i.e., "HT-AC"). As shown, the low-e panels described herein exhibit $R_g$ $\Delta E^*$ values of 2.42.

As an additional benefit, any additional manufacturing costs may be minimized because many of the layers in the low-e stacks described herein utilize materials used in the other layers (e.g., niobium, zinc, tin, etc). As a result, the total number of targets that are required to form the low-e stacks may be minimized, which reduces manufacturing costs.

Figure 5:
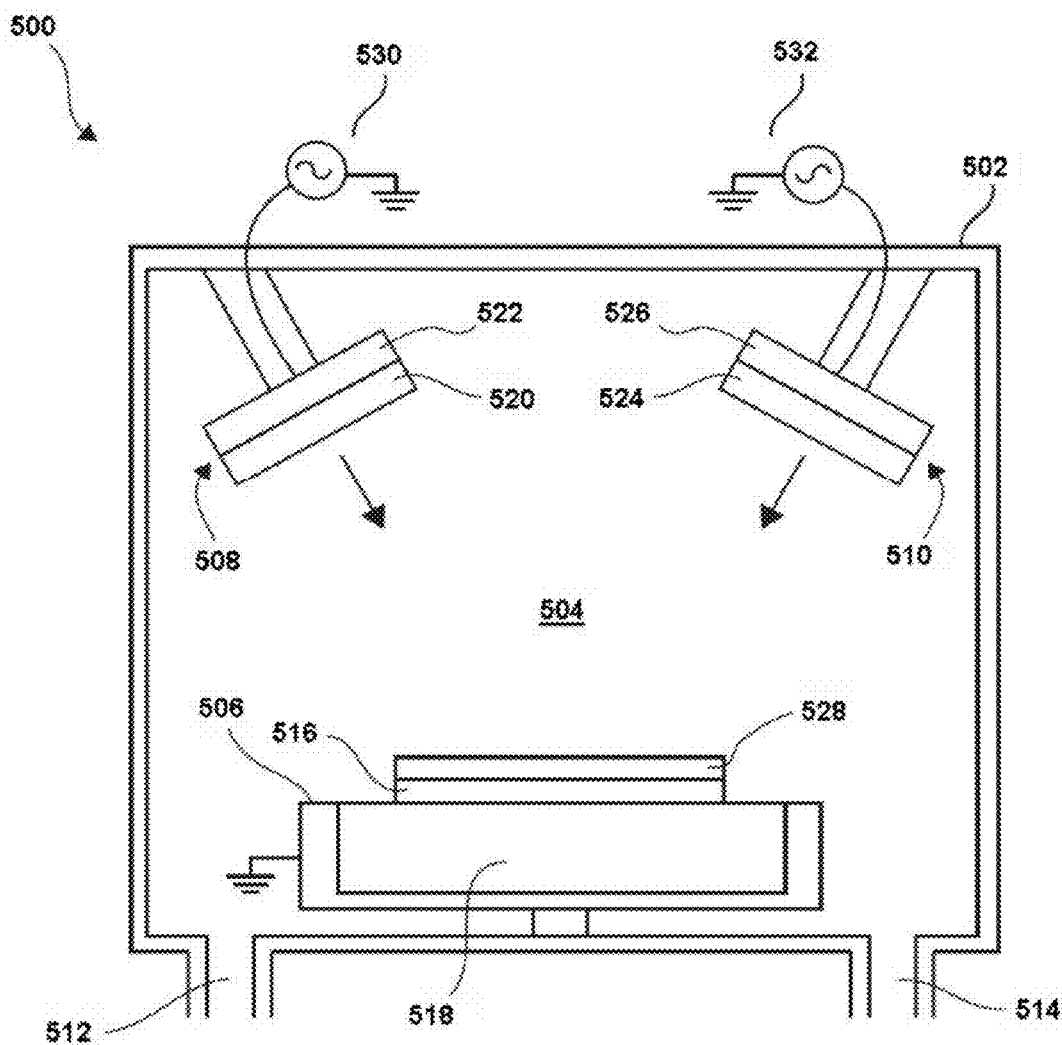
FIG. 5 is a simplified cross-sectional diagram illustrating a physical vapor deposition (PVD) tool according to some embodiments.

FIG. 5 provides a simplified illustration of a physical vapor deposition (PVD) tool (and/or system) 500 which may be used to formed the low-e panels and/or the low-e stacks described above, in accordance with some embodiments. The PVD tool 500 shown in FIG. 5 includes a housing 502 that defines, or encloses, a processing chamber 504, a substrate support 506, a first target assembly 508, and a second target assembly 510.

The housing 502 includes a gas inlet 512 and a gas outlet 514 near a lower region thereof on opposing sides of the substrate support 506. The substrate support 506 is positioned near the lower region of the housing 502 and in configured to support a substrate 516. The substrate 516 may be a round glass (e.g., borosilicate glass) substrate having a diameter of, for example, about 200 mm or about 300 mm. In other embodiments (such as in a manufacturing environment), the substrate 516 may have other shapes, such as square or rectangular, and may be significantly larger (e.g., about 0.5-about 6 m across). The substrate support 506 includes a support electrode 518 and is held at ground potential during processing, as indicated.

The first and second target assemblies (or process heads) 508 and 510 are suspended from an upper region of the housing 502 within the processing chamber 504. The first target assembly 508 includes a first target 520 and a first target electrode 522, and the second target assembly 510 includes a second target 524 and a second target electrode 526. As shown, the first target 520 and the second target 524 are oriented or directed towards the substrate 516. As is commonly understood, the first target 520 and the second target 524 include one or more materials that are to be used to deposit a layer of material 528 on the upper surface of the substrate 516.

The materials used in the targets 520 and 524 may, for example, include tin, zinc, tin, magnesium, aluminum, lanthanum, yttrium, titanium, antimony, strontium, bismuth, silicon, silver, nickel, chromium, niobium, or any combination thereof (i.e., a single target may be made of an alloy of several metals). Additionally, the materials used in the targets may include oxygen, nitrogen, or a combination of oxygen and nitrogen in order to form oxides, nitrides, and oxynitrides. Additionally, although only two targets 520 and 524 are shown, additional targets may be used.

The PVD tool 500 also includes a first power supply 530 coupled to the first target electrode 522 and a second power supply 532 coupled to the second target electrode 524. As is commonly understood, the power supplies 530 and 532 pulse direct current (DC) power to the respective electrodes, causing material to be, at least in some embodiments, simultaneously sputtered (i.e., co-sputtered) from the first and second targets 520 and 524.

During sputtering, inert gases, such as argon or krypton, may be introduced into the processing chamber 504 through the gas inlet 512, while a vacuum is applied to the gas outlet 514. However, in embodiments in which reactive sputtering is used, reactive gases may also be introduced, such as oxygen and/or nitrogen, which interact with particles ejected from the targets (i.e., to form oxides, nitrides, and/or oxynitrides).

Although not shown in FIG. 5, the PVD tool 500 may also include a control system having, for example, a processor and a memory, which is in operable communication with the other components shown in FIG. 5 and configured to control the operation thereof in order to perform the methods described herein.

Further, although the PVD tool 500 shown in FIG. 5 includes a stationary substrate support 506, it should be understood that in a manufacturing environment, the substrate 516 may be in motion (e.g., an inline configuration) during the various layers described herein.

Figure 6:
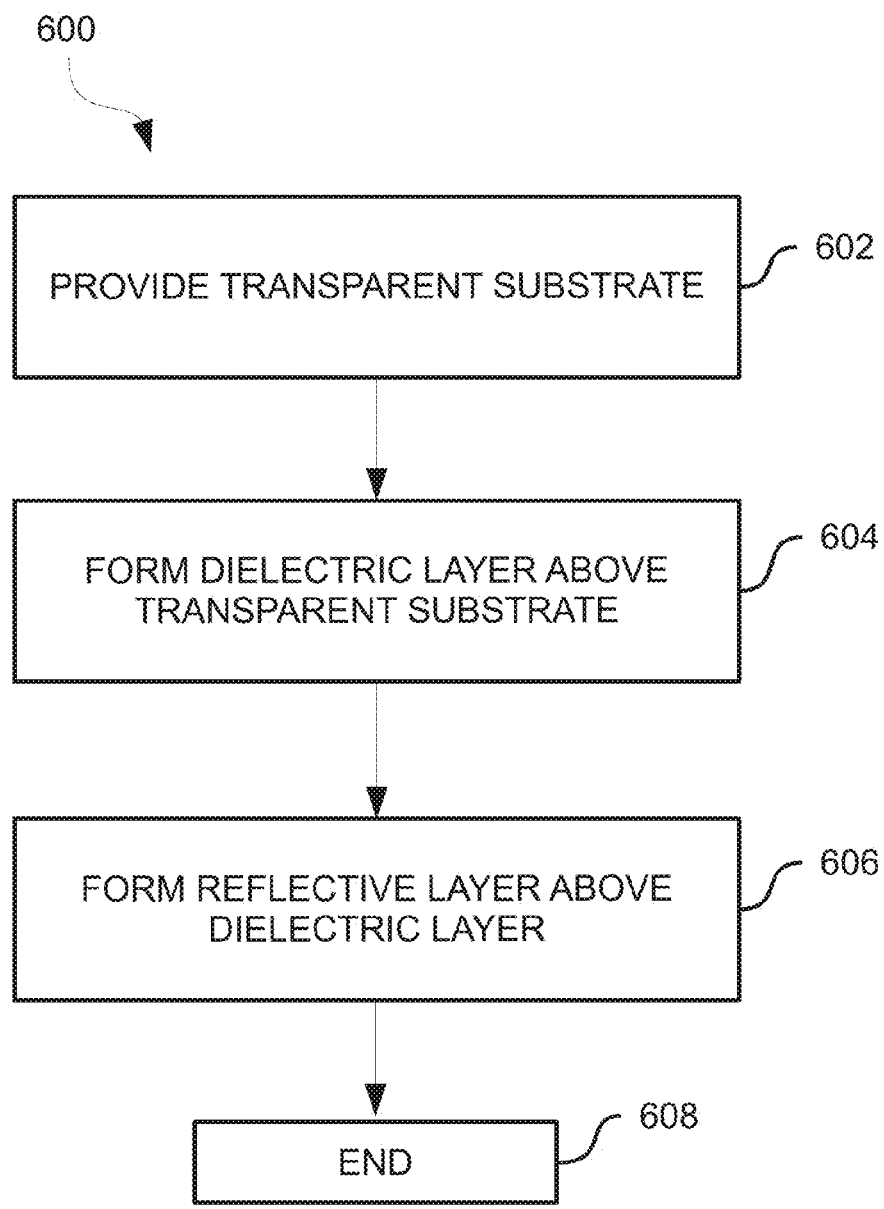
FIG. 6 is a flow chart illustrating a method for forming a low-e panel according to some embodiments.

FIG. 6 is a flow chart illustrating a method 600 for forming a low-e panel according to some embodiments. The method 600 begins at block 602 by providing a transparent substrate, such as the examples described above (e.g., glass).

At block 604, a dielectric layer is formed above the transparent substrate. The dielectric layer includes niobium, tin, aluminum, or a combination thereof. In some embodiments, the dielectric layer is made of niobium-tin-aluminum oxide. Block 604 may also include the formation of other layers above the transparent substrate, such as the lower protective layer and base layer described above, as well as the formation of various layers above the dielectric layer, such as the seed layer described above.

At block 606, a reflective layer is formed above the dielectric layer (and any other layers formed at block 604). In some embodiments, the reflective layer is made of silver. Block 606 may also include the formation of other layers above the reflective layer, such as the barrier layer, the over-coating layers, and the upper protective layer described above. At block 608, the method 600 ends.

Thus, in some embodiments, a method for forming a low-e panel is provided. A transparent substrate is provided. A reflective layer is formed above the transparent substrate. A dielectric layer is formed between the transparent substrate and the reflective layer using physical vapor deposition. The dielectric layer includes niobium, tin, and aluminum.

In some embodiments, a method for forming a low-e panel is provided. A transparent substrate is provided. A reflective layer is formed above the transparent substrate. The reflective layer includes silver. A metal oxide layer is formed between the transparent substrate and the reflective layer. A dielectric layer is formed between the transparent substrate and the metal oxide layer using physical vapor deposition. The dielectric layer includes niobium-tin-aluminum oxide.

In some embodiments, a low-e panel is provided. The low-e panel includes a transparent substrate, a reflective layer, and a dielectric layer. The reflective layer is above the transparent substrate. The dielectric layer is between the transparent substrate and the reflective layer. The dielectric layer includes niobium-tin-aluminum oxide.

Although the foregoing examples have been described in some detail for purposes of clarity of understanding, the invention is not limited to the details provided. There are many alternative ways of implementing the invention. The disclosed examples are illustrative and not restrictive.

What is claimed is:
1. A low-e panel comprising:
   a transparent substrate;
   a metal oxide layer formed directly on the transparent substrate, wherein the metal oxide layer consists of zinc-tin oxide, titanium oxide, zinc oxide, tin oxide, or aluminum-tin oxide;

a dielectric layer formed directly on the metal oxide layer, wherein the dielectric layer comprises niobium-tin-aluminum oxide; and a reflective layer formed above the dielectric layer.

2. The low-e panel of claim 1, wherein the metal oxide layer consists of zinc-tin oxide, titanium oxide, tin oxide, or aluminum-tin oxide.

3. The low-e panel of claim 2, further comprising a second metal oxide layer formed between the dielectric layer and the reflective layer, wherein the second metal oxide layer consists of zinc oxide, and the reflective layer is formed directly on the second metal oxide layer.

4. The low-e panel of claim 3, wherein the transparent substrate comprises glass.

5. A low-e panel comprising:
a transparent substrate;
a metal oxide layer formed directly on the transparent substrate, wherein the metal oxide layer consists of zinc-tin oxide, titanium oxide, tin oxide, or aluminum-tin oxide;
a dielectric layer formed directly on the metal oxide layer, wherein the dielectric layer comprises niobium-tin-aluminum oxide;
a seed layer formed directly on the dielectric layer, wherein the seed layer comprises zinc; and
a reflective layer formed directly on the seed layer.

6. The low-e panel of claim 5, wherein the seed layer comprises zinc oxide.

7. The low-e panel of claim 6, wherein the dielectric layer consists of niobium-tin-aluminum oxide.

8. The low-e panel of claim 7, wherein the metal oxide layer consists of zinc-tin oxide.

9. The low-e panel of claim 8, wherein the metal oxide layer is formed directly on the transparent substrate.

10. The low-e panel of claim 8, further comprising a protective layer formed directly on the transparent substrate, wherein the metal oxide layer is formed directly on the protective layer.

11. The low-e panel of claim 10, wherein the protective layer comprises silicon nitride.

12. The low-e panel of claim 8, wherein the reflective layer comprises silver, and the transparent substrate comprises glass.

13. A low-e panel comprising:
a transparent substrate, wherein the transparent substrate comprises glass;
a first metal oxide layer formed directly on the transparent substrate, wherein the first metal oxide layer consists of zinc-tin oxide, titanium oxide, tin oxide, or aluminum-tin oxide;
a first dielectric layer formed directly on the first metal oxide layer, wherein the first dielectric layer comprises niobium-tin-aluminum oxide;
a first seed layer formed directly on the first dielectric layer, wherein the first seed layer comprises zinc oxide;
a first reflective layer formed directly on the first seed layer, wherein the first reflective layer comprises silver;
a first barrier layer formed directly on the first reflective layer, wherein the first barrier layer comprises at least one of nickel, titanium, niobium, or a combination thereof;
a second metal oxide layer formed directly on the first barrier layer, wherein the second metal oxide layer consists of zinc-tin oxide, titanium oxide, tin oxide, or aluminum-tin oxide;
a second dielectric layer formed directly on the second metal oxide layer, wherein the second dielectric layer comprises niobium-tin-aluminum oxide;
a second seed layer formed directly on the second dielectric layer, wherein the second seed layer comprises zinc oxide;
a second reflective layer formed directly on the second seed layer, wherein the second reflective layer comprises silver;
a second barrier layer formed directly on the second reflective layer, wherein the second barrier layer comprises at least one of nickel, titanium, niobium, or a combination thereof;
a first over-coating layer formed directly on the second barrier layer, wherein the first over-coating layer consists of zinc-tin oxide, titanium oxide, tin oxide, or aluminum-tin oxide;
a second over-coating layer formed directly on the first over-coating layer, wherein the second over-coating layer comprises zinc oxide; and
a protective layer formed directly on the second over-coating layer, wherein the protective layer comprises silicon nitride.

14. The low-e panel of claim 13, wherein each of the first dielectric layer and the second dielectric layer consists of niobium-tin-aluminum oxide.

15. The low-e panel of claim 14, wherein each of the first metal oxide layer and the second metal oxide layer consists of zinc-tin oxide.

* * * * *